US006607650B1

(12) United States Patent
Niuya et al.

(10) Patent No.: US 6,607,650 B1
(45) Date of Patent: Aug. 19, 2003

(54) METHOD OF FORMING A PLATED LAYER TO A PREDETERMINED THICKNESS

(75) Inventors: Takayuki Niuya, Tokyo-To (JP);
Michihiro Ono, Farrer Drive (SG);
Hideto Goto, Tokyo-To (JP); Kyungho Park, Nirasaki (JP); Yoshinori Marumo, Nirasaki (JP); Katsusuke Shimizu, Tokyo-To (JP)

(73) Assignee: Tokyo Electron Ltd., Tokyo-To (JP)

( * ) Notice: Subject to any disclaimer, the term of this patent is extended or adjusted under 35 U.S.C. 154(b) by 129 days.

(21) Appl. No.: 09/665,576

(22) Filed: Sep. 18, 2000

Related U.S. Application Data

(63) Continuation of application No. PCT/JP00/04988, filed on Jul. 26, 2000.

(30) Foreign Application Priority Data

Jul. 26, 1999 (JP) .......................................... 11-210193

(51) Int. Cl.⁷ .............................. C25D 5/48; C25D 7/12
(52) U.S. Cl. ............................ 205/83; 205/81; 205/84; 205/102; 205/123; 205/157; 205/222; 205/223
(58) Field of Search ................................ 205/102, 103, 205/104, 223, 222, 81, 83, 84, 123, 157

(56) References Cited

U.S. PATENT DOCUMENTS

| | | | |
|---|---|---|---|
| 5,252,196 A | * 10/1993 | Sonnenberg et al. | 205/296 |
| 5,256,565 A | * 10/1993 | Bernhardt et al. | 437/228 |
| 5,302,278 A | * 4/1994 | Nobel et al. | 205/296 |
| 5,543,032 A | * 8/1996 | Datta et al. | 250/670 |
| 6,056,864 A | * 5/2000 | Cheung | 205/222 |
| 6,113,771 A | * 9/2000 | Landau et al. | 205/123 |
| 6,187,164 B1 | * 2/2001 | Warren et al. | 205/81 |
| 6,440,289 B1 | * 8/2002 | Woo et al. | 205/103 |

FOREIGN PATENT DOCUMENTS

| | | |
|---|---|---|
| JP | 57-141940 | 9/1982 |
| JP | 4-503532 | 6/1992 |
| JP | 4-187793 | 7/1992 |
| JP | 5-271969 | 10/1993 |
| JP | 6-302607 | 10/1994 |
| JP | 2652277 | 5/1997 |
| JP | 9-202990 | 8/1997 |
| JP | 11-87274 | 3/1999 |
| JP | 11-97391 | 4/1999 |
| JP | 11-135504 | 5/1999 |
| JP | 11-238703 | 8/1999 |

OTHER PUBLICATIONS

F. A. Lowenheim, Electroplating, McGraw–Hill Book Co., New York, 1978, pp 12–13.*

* cited by examiner

*Primary Examiner*—Roy King
*Assistant Examiner*—William T. Leader
(74) *Attorney, Agent, or Firm*—Finnegan, Henderson, Farabow, Garrett & Dunner LLP

(57) ABSTRACT

The object of the present invention is to provide a plating method capable of planarization process of high quality in comparison with the conventional plating method and also provide a plating device and a plating system adopting the plating method of the invention. In the plating method and device, an object 10 to be processed and an electrode plate 20 are dipped in a solution including objective metal ions and a forward current is supplied between the object and the electrode plate to educe a metal on the surface of the object. After forming a plating film on the object excessively, a backward current is supplied between the object 10 and the electrode 20 to uniformly remove at least part of superfluous plating film.

15 Claims, 12 Drawing Sheets

METHOD OF FORMING A PLATED LAYER TO A PREDETERMINED THICKNESS

This application is a Continuation of PCT International Application No. PCT/JP00/04988, filed Jul. 26, 2000.

TECHNICAL FIELD OF THE INVENTION

The present invention relates to a plating method, a plating device and a plating system. The present invention is suitable as a process in place of part or all of chemical mechanical polisher (CMP) step in a wafer planarization process in the manufacturing process of devices, such as copper(Cu)-wired devices.

BACKGROUND OF THE INVENTION

In recent years, with a high densification and refinement in semiconductor products, the CMP process is being watched as a supplement of lithography having a shallow depth of focus with the progress of refinement. In the CMP method process, a chemical abrasive (slurry), a pad, etc. are used to mechanically polish the object for its planarization. In place of the glass-melting method and the spin-on glass method in the past, the CMP method has been expected as a technique suitable to the planarization process in case of forming a superfine pattern less than 1 $\mu$m. Additionally, not only is the CMP method employed for the planarization, but also the CMP method is used to form an embedded wiring (damascene). The reason is that the wiring line can be formed with high accuracy by etching an oxidation film rather than etching a metal.

Meanwhile, this technical field is now investigating the next-coming wiring material capable of coping with high speed, high reliability and high integration in a semiconductor element. The use of copper (Cu) is now under review as a substitute of materials of aluminum (Al) alloy. The use of copper has an effect on the reduction of wiring resistance and wiring delay since copper (Cu) has a resistivity of the order of 60 per cent against the resistivity of aluminum (Al). Again, copper (Cu) has a high melting point and the copper's life of an electro-migration is larger than that of aluminum (Al), on the order of about three figures with high reliability.

Since the steam pressure of copper is too high to form a pattern by normal etching, it is especially desirable to adopt the CMP method for the damascene process utilizing copper. The damascene process is effective in wiring in case of using a serious material in etching and has an effect to reduce the manufacturing cost which is apt to rise with an increase of wiring steps by multi-layer wiring. In the damascene process, a method allowing embedding the bier and forming the wiring line simultaneously is called as "dual damascene" particularly. According to the dual damascene, the wiring line and the bier (note: Contact hole is the general term for these elements in this specification, below.) are firstly dug in a layer insulating film. Subsequently, copper is embedded into the contact hole by an electrolytic plating method etc. After the formation of Cu film, superfluous copper besides copper embedded in the contact hole is eliminated for planarization by a Cu-CMP method.

However, the Cu-CMP method has a typical problem of over-polishing. This over-polishing means that a plating film of Cu is ground excessively and sometimes the over-polishing is explained by technical terms of "dishing" and "erosion". With reference to FIG. 22, we now explain both dishing and erosion below. A wafer consists of an insulating film and a metal (film) 16 (16a and 16b). In the figure, reference numeral I designates an area having low wiring density, while II denotes another area having high wiring density.

In the area I of low wiring density, there is a dish-shaped depression formed in an embedded metal 16b due to the softness of a grinding pad, in spite of the presence of the insulating film 14 as a stopper against the grinding. This phenomenon is known as "dishing " in this field. On the other hand, in the area II of high wiring density, the insulating film 14 has not a strength becoming to the stopper because of its small area. Additionally, since the insulating film 14 differs from the metal 16 in terms of frictional coefficient against the grinding, it is also difficult to control the grinding process. As a result, the insulating film 14 is also ground together with the metal 16b. This phenomenon is known as "erosion" in this field.

The dishing can be lightened by using a pad of hard material or forming a dummy pattern in such the area having low wiring density. However, the pad being too hard is apt to produce fine scars (scratches) on the surface of the semiconductor, causing an inferior device. Therefore, it is difficult to select an appropriate material for the grinding pad. Although the erosion can be also reduced by the use of a pad of hard material, which is similar to the dishing, there is required a more careful control than that of the dishing. In this way, the over-polishing causes the deformation of wafer and the reduction in wafer thickness. Furthermore, the grinding of metal in the contact hole causes the increase of a wiring resistance or the snapping of a wire thereby to impede the manufacturing of high-quality semiconductor elements. For example, other explanations about both dishing and erosion are disclosed in pages 96 to 99 in the January issue of the Electric Journal published on 1999.

DISCLOSURE OF THE INVENTION

Under such a situation, an exemplified and omnibus object of the present invention is to provide a new and useful plating method, a plating device and a plating system embodying the method, all of which can solve the above-mentioned conventional problem.

Particularly, the exemplified object of the present invention is to provide a plating method which can offer the planarization treatment of high quality in comparison with the conventional plating method and also provide a plating device adopting such the plating method.

In accordance with the first feature of the invention, it is characterized by a plating method comprising the steps of dipping an object to be processed and an electrode plate into a solution containing designated metal ions; allowing a forward current to flow through the object and the electrode thereby to form a metal film originated from the designated metal ions on the object; and allowing a backward current to flow through the object and the electrode thereby to remove a part of the metal film formed on the object. According to the above method, a part of excessive metal can be uniformly eliminated thereby to contribute to the planarization of the surface of the object.

In accordance with the second feature of the invention, it is characterized by a plating method comprising the steps of forming a superfluous amount of metal film on an object to be processed; dipping the object and an electrode plate into a solution containing metal ions as a base of the metal film; and allowing a designated backward current to flow through the object and the electrode thereby to remove a part of the metal film formed on the object. Also in this method, since the part of excessive metal can be eliminated uniformly, it is possible to contribute to the planarization of the surface of the object.

In accordance with the third feature of the invention, the forward current is characterized by an electrical current having its variable magnitude.

In accordance with the fourth feature of the invention, the backward current is characterized by an electrical current having its variable magnitude.

In accordance with the fifth feature of the invention, it is characterized by the above-mentioned plating method further comprising the steps of measuring the forward current; calculating a thickness of the metal film on the object by the forward current measured; and judging whether the thickness of the metal film is in excess of a designated thickness, wherein the removing step is initiated when it is judged at the judging step that the thickness of the metal film is in excess of the designated thickness.

In accordance with the sixth feature of the invention, the above plating method is characterized in that the metal is identical to copper and the object to be processed is a semiconductor wafer having contact holes.

In accordance with the seventh feature of the invention, the solution containing the metal ions is a solution containing at least sulfuric acid.

In accordance with the eighth feature of the invention, the solution containing the metal ions is a solution containing at least phosphoric acid.

In accordance with the ninth feature of the invention, the solution containing the metal ions is a solution containing at least acetic acid.

In accordance with the tenth feature of the invention, the solution containing the metal ions is a solution containing at least nitric acid.

In accordance with the eleventh feature of the invention, the solution containing the metal ions is a solution containing at least hydrochloric acid.

In accordance with the twelfth feature of the invention, the metal film formed on the object is removed to have one tenth of the thickness at the removing step, and the plating method further comprises the step of secondly removing a superfluous metal film on the object by executing a chemical mechanical polishing after finishing the removing step.

In accordance with the thirteenth feature of the invention, the above plating method further comprises the step of forming a barrier metal layer on the object to be processed.

In accordance with the fourteenth feature of the invention, the above plating method further comprises the step of forming a seed layer on the object to be processed.

In accordance with the fifteenth feature of the invention, the above plating method further comprises the step of allowing the backward current to flow through the object and the electrode plate thereby to remove a part of the barrier metal layer formed on the object.

In accordance with the sixteenth feature of the invention, it is characterized by a plating device for plating an object to be processed, comprising a cell allowing the object and an electrode plate to be dipped therein, the cell being capable of accommodating a solution containing designated metal ions for plating; a switch for connecting the object and the electrode plate to a desired polarity of a power source of direct current; and a control unit for controlling the switch in a manner that a forward current flows through the object and the electrode in case of forming a metal film originated from the designated metal ions on the object, while a backward current flows through the object and the electrode in case of removing a surplus of the metal film formed on the object. This plating device allows the backward current to flow in case of removing the superfluous metal film.

In accordance with the seventeenth feature of the invention, it is characterized by a plating system comprising a transporting device for transporting an object to be processed; a plating device for applying a plating process on the object; and a cleaning device for washing and cleaning the object subjected to the plating process. Also in this plating system, the plating device includes a cell allowing the object and an electrode plate to be dipped therein, the cell being capable of accommodating a solution containing designated metal ions for plating; a switch for connecting the object and the electrode plate to a desired polarity of a power source of direct current; and a control unit for controlling the switch in a manner that a forward current flows through the object and the electrode in case of forming a metal film originated from the designated metal ions on the object, while a backward current flows through the object and the electrode in case of removing a surplus of the metal film formed on the object. The plating system has an operation similar to that of the above plating device.

In accordance with the eighteenth feature of the invention, the plating system further comprises a barrier metal etching bath for removing the barrier metal layer from the object.

In accordance with the nineteenth feature of the invention, the plating system further comprises a device having a function to measure a film thickness of a plating layer.

In accordance with the twentieth feature of the invention, the plating system further comprises an annealing device for performing an annealing process.

BEST MODE OF EMBODIMENTS OF THE INVENTION

Figure 1:
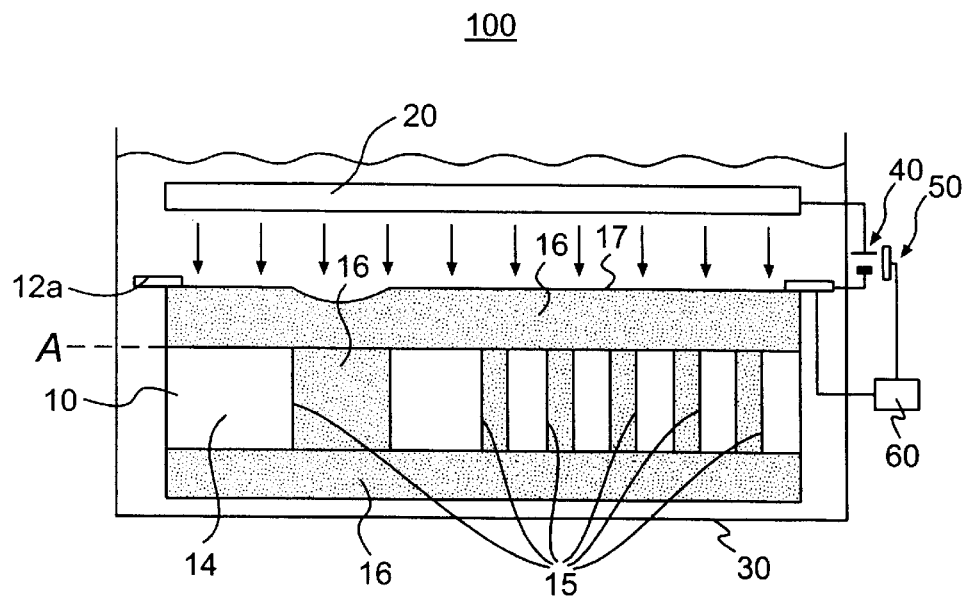
FIG. 1 is a schematic view of a plating apparatus in accordance with one embodiment of the present invention, showing a condition to form a metal plating film on an object to be processed.

One embodiment of the present invention will be described below, with reference to FIGS. 1 to 21. Note that FIGS. 1 and 2 of these figures are conceptual figures for explanation of the plating method and the plating device of the invention on principle. FIGS. 7 to 16 are view for subsequent explanation of the sectional changes of a semiconductor wafer in case of applying the plating method and the plating device of the invention to a practical damascene process. Note that elements in common with the respective figures are indicated with the same reference numerals respectively and their overlapping descriptions are eliminated.

Figure 2:
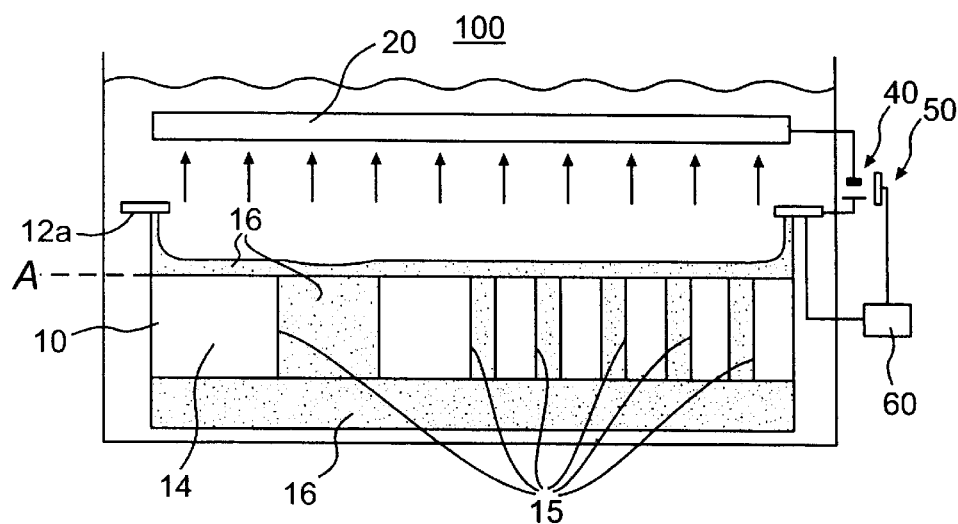
FIG. 2 is a schematic view showing a condition to remove the metal plating film from the object by using the plating apparatus of FIG. 1.

FIGS. 1 and 2 show a plating device 100 respectively. The plating device 100 includes an object 10 to be plated, an electrode 12a connected to the object 10, an electrode plate 20 arranged to oppose the object 10, a cell 30 which is filled with a solution containing metal ions essential to this plating process and into which the object 10 and the electrode plate 20 are dipped, a direct-current source 40, a switch 50 for changing the direction of current and a control unit 60 for controlling the operation of the switch 50. Although the plating device 100 is applicable to the damascene process, the object 10 to be processed is not limited to a semiconductor wafer only. We describe the application of the plating device 100 to the damascene process below.

In the embodiment, the object 10 to be processed is identical to the semiconductor wafer and has an insulating film 14, such as $SiO_2$, SiOF, and a wiring metal 16. Connected with the object 10 is the electrode 12a which is used for the formation of a plating film (i.e. an eduction membrane of the metal 16), the removal of a superfluous plating film and the measurement of a thickness of the plating film formed on a wafer surface A. In the forming process of the plating film, the metal 16 is excessively applied on the insulating film 14 having a desired wiring pattern formed thereon. The "needed" amount of the metal 16 is equal to an amount necessary and sufficient to fill the contact hole formed in the insulating film 14.

Figure 5:
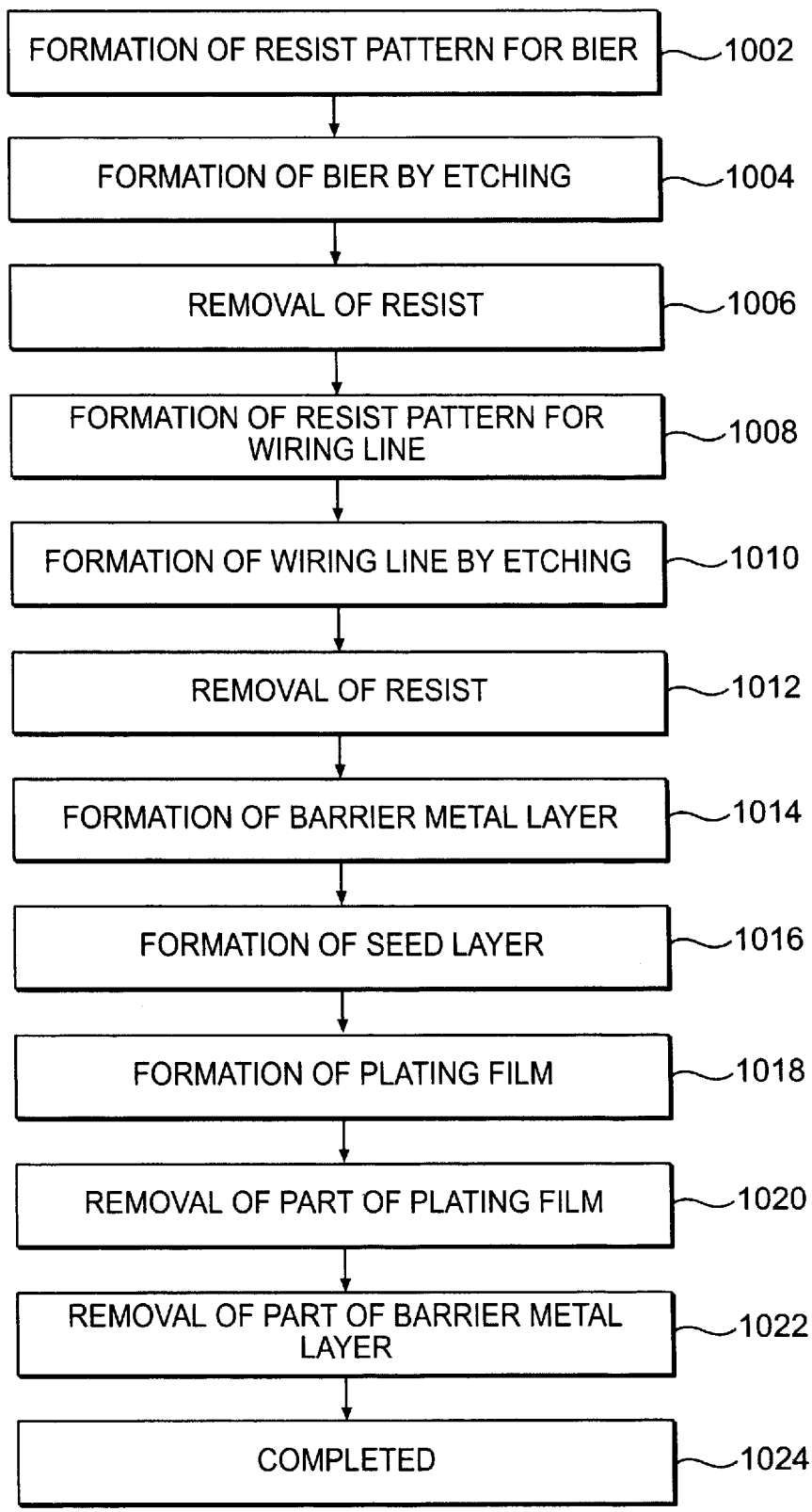
FIG. 5 is a flow chart of a treatment to be applied on the object.

In a semiconductor manufacturing process, such as damascene process, the processing procedure preceding the application of the plating method and the plating device of FIGS. 1 and 2 will be described with reference to FIGS. 5 and 7 to 13. Here, FIG. 5 is a flow chart of the treatment applied on the object 10 to be processed. FIGS. 7 to 13 are views showing the sections of the object at the respective steps of FIG. 5. Note that FIGS. 1 and 2 are views for principled explanation of the plating method and the plating device in principle and therefore, the configurations of the object 10 and the contact hole 15 are different from the same of the objects 10a to 10c shown in FIGS. 7 to 16.

Figure 7:
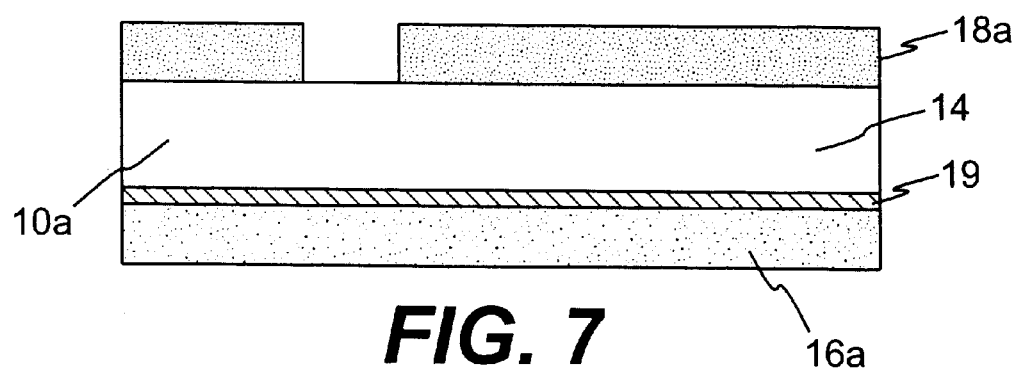
FIG. 7 is a schematically sectional view showing a condition where a resist pattern to form a desired bier is formed on a semiconductor wafer.

Referring to FIGS. 5 and 7, a resist 18a is firstly formed on a wafer 10a, for forming a desired bier thereon (step 1002). At first, a photo-resist composed of photosensitive resin is pasted on the wafer having a metal layer 16a, a SiN layer 19 and the insulating film 14. Subsequently, a well-known masking unit in this field is used to expose the resist 18a optically. For the insulating film 14, for example, $SiO_2$ is employed. For the metal layer 16a, there may be employed a chemical element, such as Cu, Au, Pt. In case of Cu for the metal layer 16a, the SiN film 19 is added to prevent the exposure of Cu in view of the prevention of Cu from being oxidized in the later-described ashing process using oxygen. For a mask, for example, a hard mask patterned with chromium or chromium-oxide is used. Either contact exposure or projection exposure will do as the optical alignment. Since the development of an exposed photo-resist allows an exposed or non-exposed area to dissolve in a developer, the resist layer in the exposed or non-exposed area is removed to form the resist 18a, as shown in FIG. 7. Note that the pattern formation is well-known as the lithography in this field and therefore the detailed description is eliminated.

Figure 8:
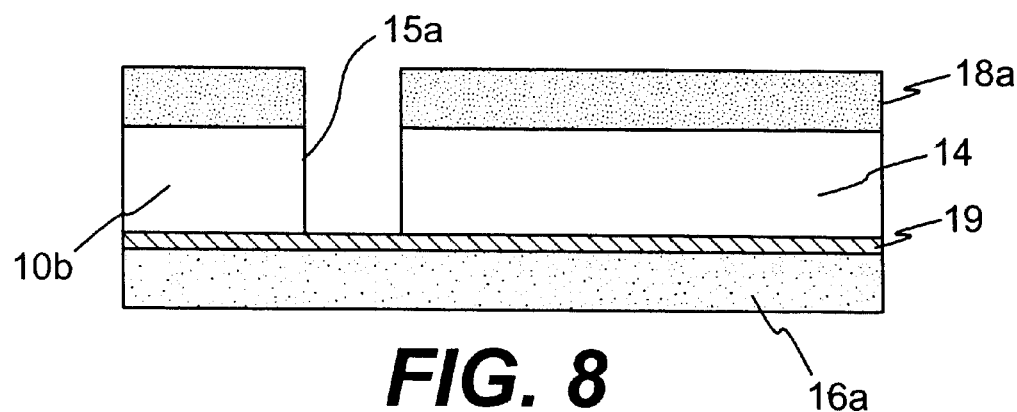
FIG. 8 is a schematically sectional view showing a condition where the bier is formed on the semiconductor wafer in accordance with the resist pattern of FIG. 7.

As shown in FIGS. 5 and 8, the dry etching using the resist 18a of FIG. 7 is carried out to form a bier 15a in the insulating film 14 (step 1004). The resist 18a functions as a protective film (mask) for covering an area where no dry etching is desired. According to the embodiment, in view of the accurate etching, the insulating film 14 is etched up to the SiN film 19 by e.g. anisotropic etching.

Figure 9:
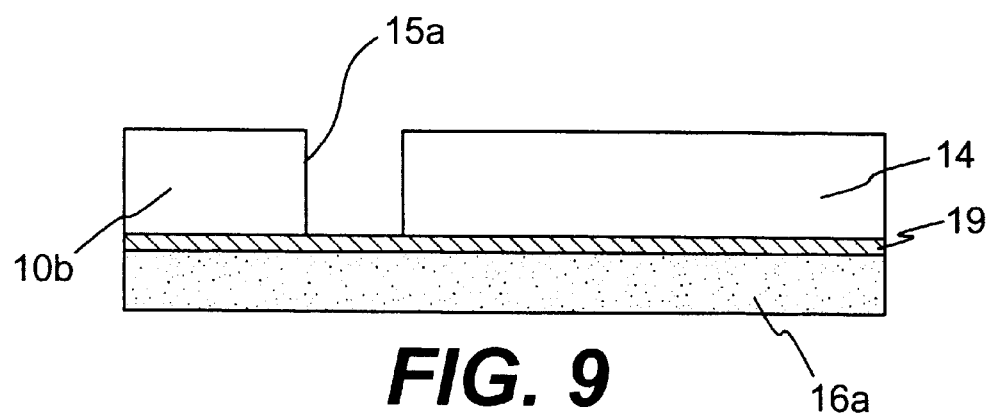
FIG. 9 is a schematically sectional view showing a condition where a resist is removed from the semiconductor wafer of FIG. 8.

As shown in FIGS. 5 and 9, the resist 18a and SiN on the metal layer 16a are removed from the wafer 10b having the bier 15a (step 1006). As mentioned above, the removal of the resist 18a is completed by means of ashing as one dry-etching technique. In the ashing, the resist 18a is removed by making used of oxygen radicals. A plasma device or an ozone-dissolving device is used for a generator of oxygen radicals. As the resist 18a includes carbon, hydrogen and oxygen as constituents, the contact with remarkably-reactive oxygen radicals generated by the above device allows the resist 18a to be removed as carbon dioxide and water vapor.

Figure 10:
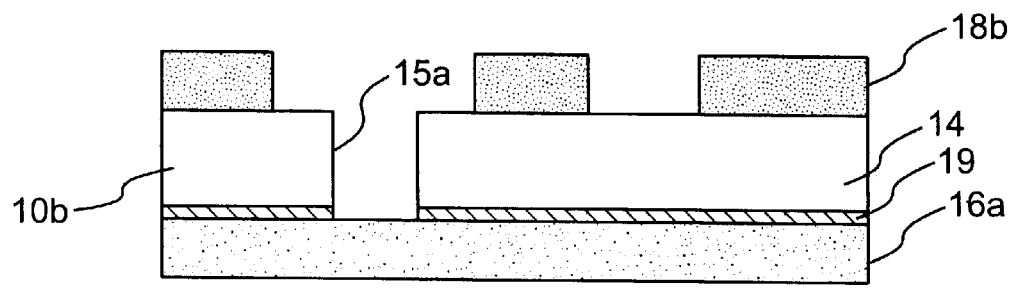
FIG. 10 is a schematically sectional view showing a condition where a resist pattern to form a desired wiring line is formed on the semiconductor wafer of FIG. 9.

Next, as shown in FIGS. 5 and 10, a resist pattern for establishing a desired wiring line is formed on the wafer 10b (step 1008). At step 1008, it is executed similarly to step 1002 to form a resist 18b for the desired wiring line.

Figure 11:
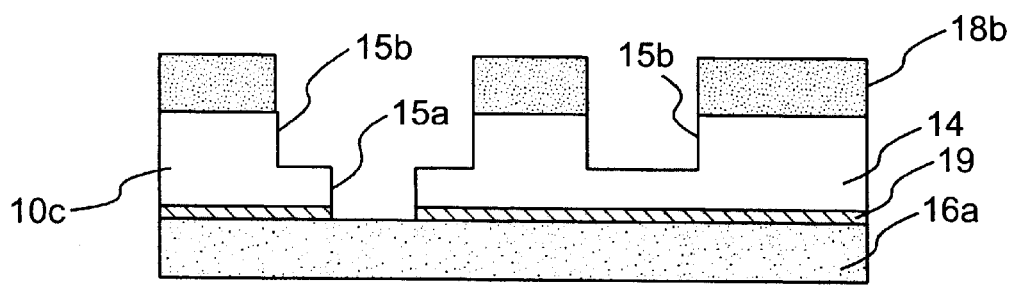
FIG. 11 is a schematically sectional view showing a condition where a wiring pattern is formed on the semiconductor wafer in accordance with the resist pattern of FIG. 10.

In FIGS. 5 and 11, the dry etching is carried out while using the resist 18b of FIG. 10 thereby to form a wiring line 15b on the insulating film 14 (step 1010). The resist 18b functions as the protective film (mask) for covering an area where no dry etching is desired. The process at step 1010 is executed as similar to that at step 1004. Consequently, the insulating film 14 is provided with the bier 15a and the wiring line 15b shown in FIG. 10. In building the wiring line 15b, it is necessary to remove the insulating film 14 so as not to break the configuration of the bier 15a.

Figure 12:
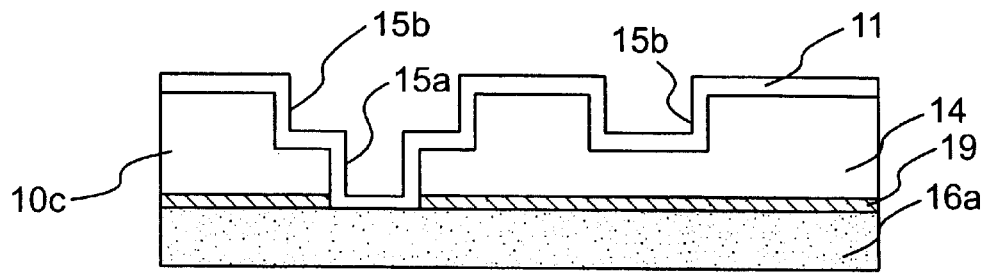
FIG. 12 is a schematically sectional view showing a condition where the resist is removed from the semiconductor wafer of FIG. 11.

As shown in FIGS. 5 and 12, the resist 18b is removed from the wafer 10c having the wiring line 15b (step 1012). The removal of the resist 18b is also completed by means of the ashing as one dry-etching technique. The process at step 1012 is carried out similarly to that at step 1006. Thereafter, the metal 16b is embedded in the bier 15a and the wiring line 15b: nevertheless, as shown in FIG. 12, it is an option before the embedding of metal to form a barrier metal layer 11 for preventing the metal 16b from diffusing into the insulating film 14 and the lower metal layer 16a (step 1014). Materials in the TiN-family or the same in the Ta-family represented by tantalum nitride may be employed for the barrier metal layer 11. Note that the formation of the barrier layer 11 can be accomplished by using any method known in this field and therefore the detailed explanation is eliminated.

Figure 13:
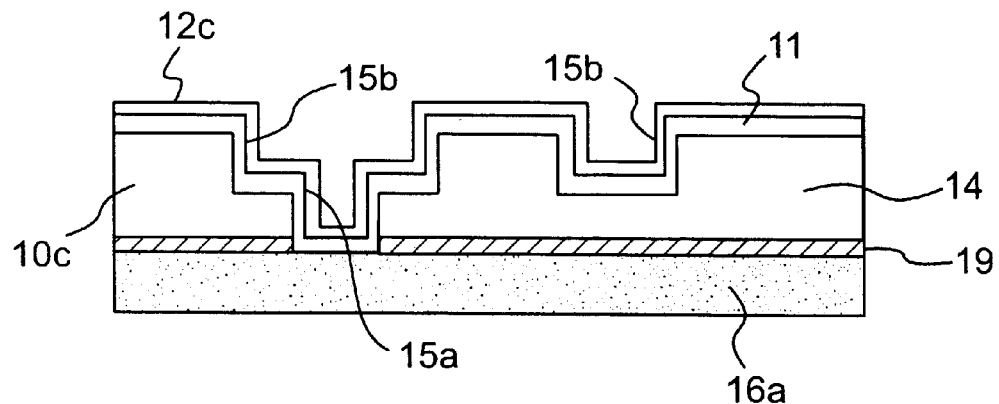
FIG. 13 is a schematically sectional view showing a condition where a seed layer is formed on the semiconductor wafer of FIG. 12.

Next, as shown in FIGS. 5 and 13, a seed layer 12c is formed on the barrier metal layer 11 (step 1016).

Figure 14:
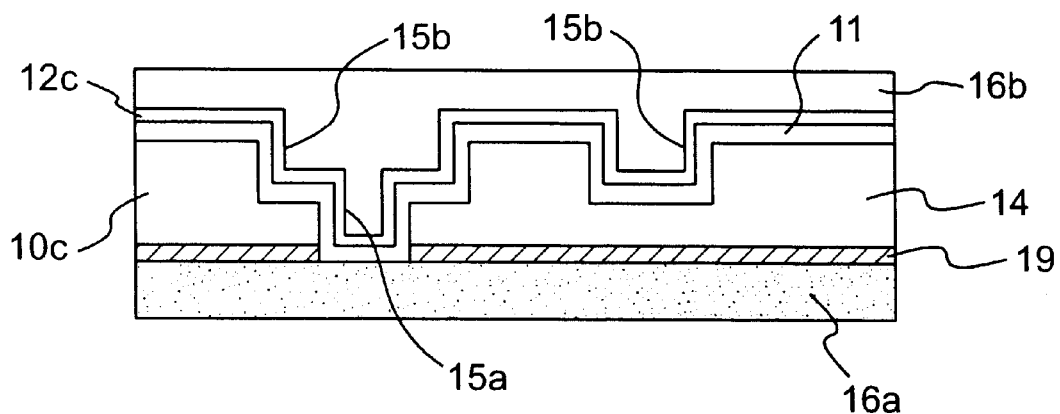
FIG. 14 is a schematically sectional view showing a condition where a metal is embedded in the bier and the wiring line of the semiconductor wafer of FIG. 13.
Figure 15:
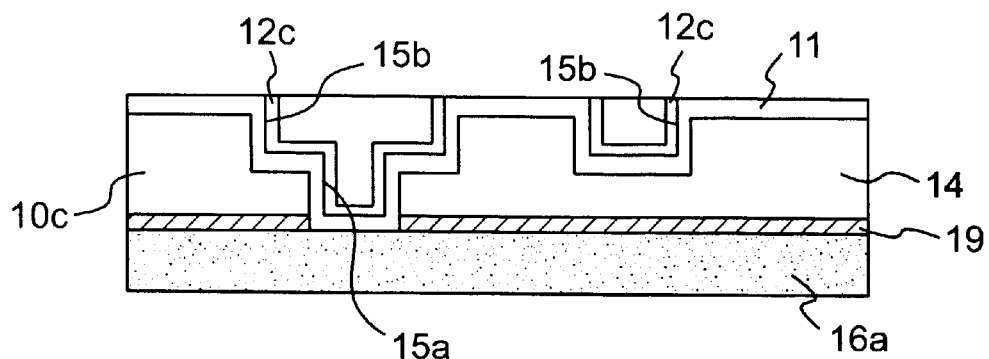
FIG. 15 is a schematically sectional view showing a condition where a superfluous metal film and a part of seed layer are removed from the semiconductor wafer of FIG. 14.

Next, as shown in FIGS. 5 and 14, it is executed in the metal plating to embed the metal 16b into the bier 15a and the wiring line 15b in the wafer 10c (step 1018). The wafer 10c of FIG. 14 corresponds to the object 10 shown in FIG. 1. The metal 16b is excessively piled up over the surface of the wafer 10c (i.e. a surface A of the object 10 of FIG. 1).

The methods of embedding the metal 16b are divided broadly into a dry film deposition method and a wet film deposition method. For example there are CVD (chemical vapor deposition) method and PVD (plasma vapor deposition) method in the dry film deposition method. In common with the CVD and PVD methods, it is executed for the occurrence of a chemical reaction in the vapor phase or on the surface of the wafer 10c to supply the wafer 10c with gas composed of elements constituting a thin film material, thereby forming a desired thin film. While, in the wet film deposition method, there are plating methods (i.e. electrolytic plating and non-electrolytic plating), for instance. In the plating methods, to simply dip an object(s) in a solution containing the objective metal ions, comes under the non-electrolytic plating. Although the invention does not exclude the application of either one of the film deposition methods, the object to be processed shown in FIG. 14 is produced by the electrolytic plating method adopting the plating device 100 of FIG. 1 in the following embodiment.

Figure 6:
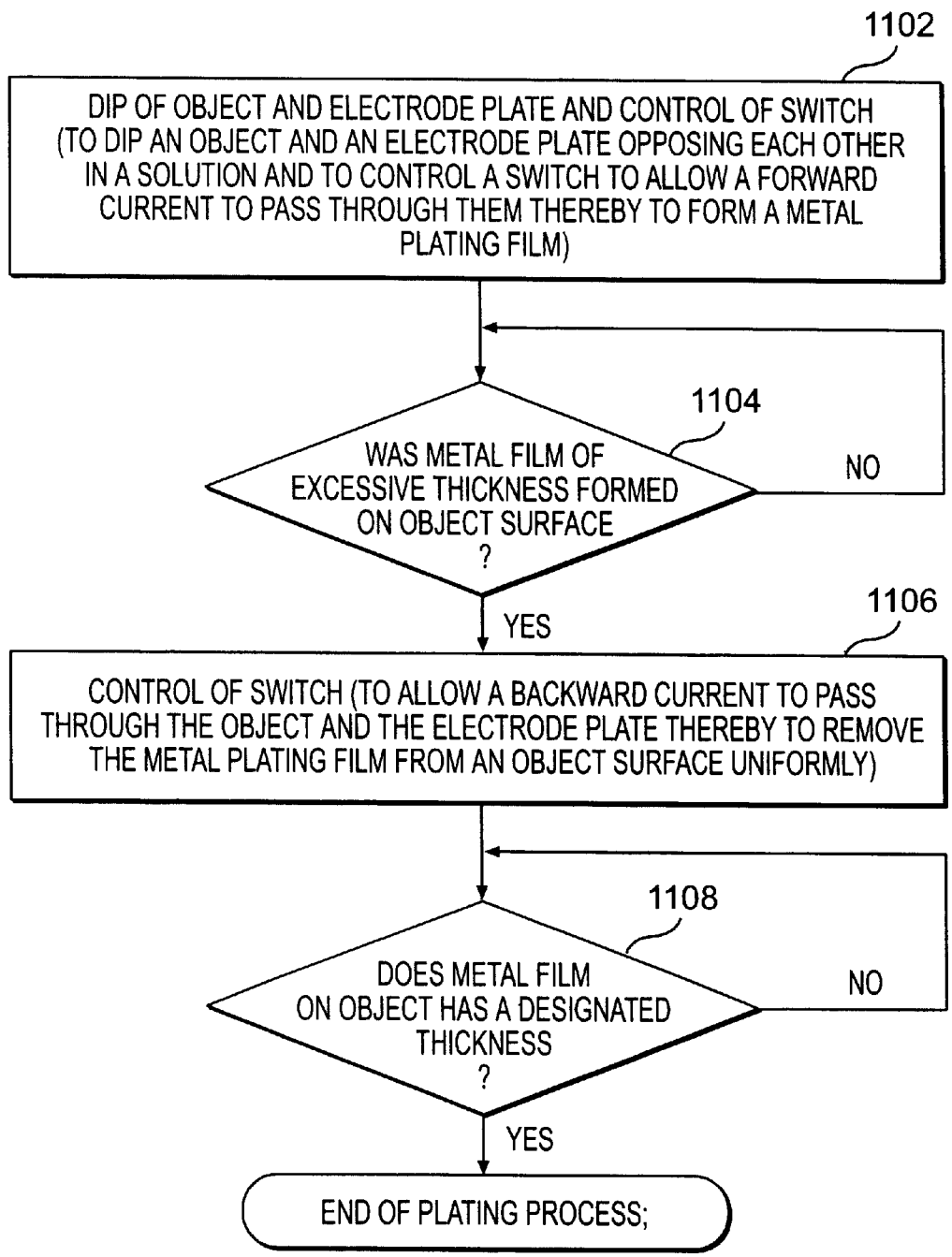
FIG. 6 is a control flow chart used for a plating process of FIGS. 1 and 2.

With reference to FIGS. 1 and 6, we now describe the electrolytic plating method which is applicable to the formation of the metal film 16b of FIG. 14. Here, FIG. 6 is a control flow chart used for the execution of the plating process of FIG. 1 and the later-mentioned plating process of FIG. 2. In this method, Cu (copper) is used as the metal film 16b. The electrolytic plating method means dipping the object in the solution containing the objective metal ions thereby to provide an electrode cathode causing the deoxidization, while allowing the forward current to flow between the above cathode and a soluble or insoluble anode (i.e. electrode causing the oxidization), thereby forming an objective metal film on the surface of the object, as an electrolytic educt.

It is noted that, in the electrolytic plating method, there has been already proposed a technique to temporarily supply the backward current during forming the plating film in order to prevent the occurrence of irregularities originating from the contact hole on the object, which would cause the impossibility of forming a flat plating film on the semiconductor wafer (for example, Japanese Patent Publication No. 2652277 and Japanese Examined Patent Publication (kokoku) No. 2-61143). According to the published technique, while making use of the nature of electrical field apt to concentrate at a projection, the backward current is supplied to electrically separate (reverse plating) a plating film from the projection, thereby dissolving into the solution. Therefore, it should be noted that this technique employs the backward current in order to form the object 10 of FIG. 1 (in detail, before forming the object 10 of FIG. 1), while the backward current is used after forming the object 10 of FIG. 1, in the plating method of the present invention described with reference to FIG. 2 later.

Figure 3:
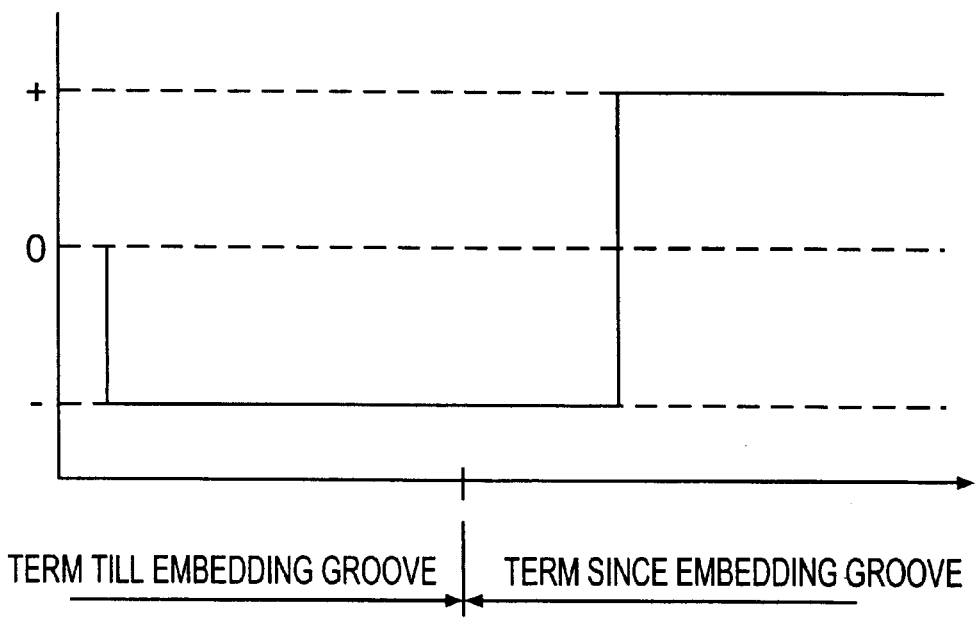
FIG. 3 is a diagram illustrating a current supplied to an electrode in the conditions of FIGS. 1 and 2.

The electrolytic plating method can be embodied by the plating device 100 of FIG. 1. First, dip the object 10 and the opposing direct-current electrode 20 in a solution, for example, a copper sulfate solution (i.e. the cell 30). Next, the electrode 12a is coupled on the object 10 to provide the cathode (negative pole) in opposition to the anode (positive pole) of the electrode plate 20. Thereafter, supply the forward current to both of the electrodes 12a, 20, as shown in FIG. 3. Then, the control unit 60 controls the switch 50 so as to allow the objective metal film 16 to educe on the object 10 in the electrolytic eduction (step 1102).

Figure 17:
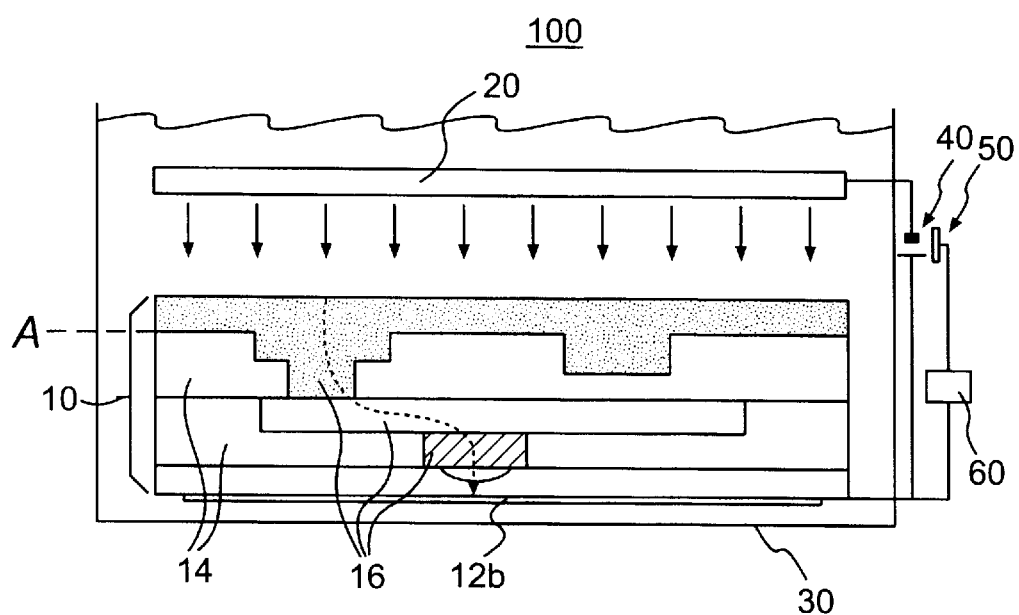
FIG. 17 is a schematically sectional view showing a modification with respect to the position of the electrode of the object to be processed of FIG. 1.

The electrode 12a may be formed in CVD, PVD or the other method. Although FIG. 1 is an explanatory diagram in case of providing the electrode 12a on a part of the object to be processed, practically as shown in FIG. 13, the seed layer 12c of metal is formed so as to have a sufficient thickness allowing the electricity through the whole surface of the object, by PVD, CVD or the other method. In this way, it is possible to form the seed layer 12c as the electrode on the barrier metal layer 11 throughout the whole surface of the object. Note that, in case of the barrier metal layer 11 of FIG. 12, it may be used in place of the electrode 12a. That is, this modification allows the electricity to flow through the barrier metal layer 11. Alternatively, the electrode 12a may be replaced by the electrode 12b as shown in FIG. 17. FIG. 17 is a schematic view of the plating device 100 having the electrode 12b in a different position. The electrode 12b is attached on the bottom of the object 10, so that the current value flowing through the object 10 is transmitted to the control unit 60. The electrode 12b is utilized for both formation and removal of the plating film. Additionally, the electrode 12b may be used in order to measure the thickness of the plating film.

At the formation of the plating film, the electrode plate 20 serves as a positive pole thereby to cause the oxidation. For the copper (Cu) plating in the embodiment, it is preferable to employ the material Cu for the positive pole.

At the positive pole, there is caused a reaction that each Cu-atom in the Cu-electrode dissolves while discharging two electrons and turns into $Cu^{2+}$ consequently.

The cell 30 is filled up with a solution (plating liquid) containing the objective metal to be plated. Because of the copper sulfate solution of the embodiment, copper sulfate is ionized into respective ions of $Cu^{2+}$ and $So_4^{2-}$ in the solution. The ion $Cu^{2+}$ is deoxidized by the negative pole thereby to form Cu as the educt. In copper sulfate as the plating liquid, the component of Cu forms the objective metal, while the component of sulfuric acid has an action to enhance the electrical conductivity of the solution thereby improving the capability of uniform electro-deposition. The plating liquid further contains chlorine and an additive. The component chlorine of a designated amount serves as an agent to accelerate both glossiness and dissolution of the positive pole, while the additive has functions to fine the crystal of Cu-atoms as an educt, improve the capability of uniform and reduce an internal stress in the object. For the other plating liquids, there are various solutions having $Ni^+$, $Fe^+$, or the like.

The direct-current source 40 is equipped with a positive pole and a negative pole. In case of supplying the designated forward current, in other words, forming a plating film, the electrode plate 20 forms the positive pole causing the oxidation, while the object 10 to be processed forms the negative pole causing the deoxidization. Accordingly, the positive pole of the source 40 is connected to the electrode plate 20, while the negative pole is connected to the object 10. In detail, the deoxidization from the ions $Cu^{2+}$ to the Cu-atoms is performed on the negative pole, while the oxidation from the Cu-atoms to the ions $Cu^{2+}$ is performed on the positive pole. Therefore, at the negative pole, the surface of the object 10 is coated with a plating film of the Cu-atoms.

Owing to the provision of the switch 50, the plating device is capable of reversing the polarity of the object 10 and the electrode plate 20 freely. In educing the metal film 16 on the object 10, the operation of the switch 50 is controlled so as to establish the above-mentioned polarity of the object 10 and the electrode plate 20, by the control unit 60. As a result, the deoxidization is produced on the surface of the object 10 forming the negative pole (the side opposing the electrode plate), so that the ionized copper ($Cu^{2+}$) acts with two electrons ($e^-$) generated from the negative pole. Thus, single-Cu is educed to plate the surface of the object 10 with copper.

Irrespective of the profile and dimensions of the contract hole 15, it is preferable that the metal film 16 is substantially flat on its upper surface 17. Because the upper surface 17 is so flattened, the metal film 16 could be uniformly removed by the plating process described with reference to FIG. 12 later. As to the planarization of the upper surface 17 of the metal film 16, there have been already proposed a variety of methods in this field. In this embodiment, it is possible to apply any of these methods on the object.

The control unit 60 is capable of detecting a thickness of the metal film 16 educed on the surface A directly or indirectly by measuring the plating time, the value of plating current, etc. When detecting the thickness of the metal film 16 by means of the plating time (time passage since the start of plating) and the plating current, it is possible to make use of data brought by a previous simulation. In general, it is expected that the smaller film thickness the metal film 16 has, the smaller the current value becomes. Such the simulation would be carried out while considering various parameters, for example, concentrations of the metal ions, temperature of the solution, the humidity, etc.

When the control unit 60 judges that all of the contact hole 15 is filled up with the metal film 16 and furthermore the surface A is covered with the metal film 16 of a designated thickness, which preferably allowing the surface 17 to be flattened generally (step 1104), then the unit 60 controls the switch 50 so that the backward current is supplied to remove at least part of the metal film 16 formed on the surface A of the insulating film 14, as shown in FIG. 3 (step 1106). With reference to FIGS. 2 to 6, 15 and 16, the removal process will be described below. Hereat, FIG. 2 is a schematically sectional view of the plating device 100 performing the present plating method.

Figure 16:
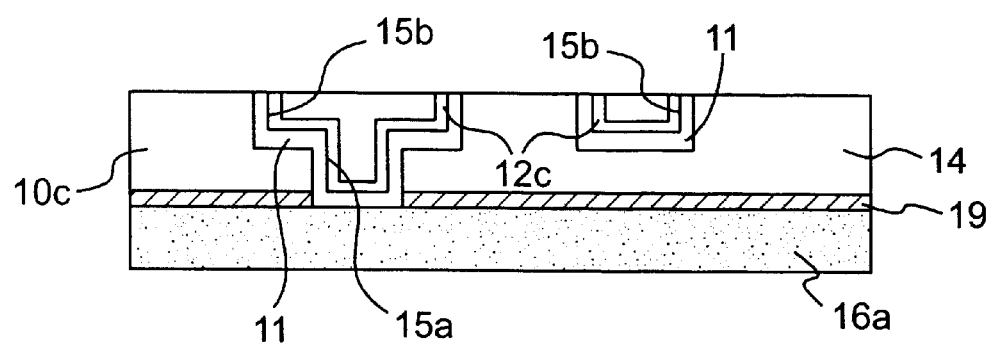
FIG. 16 is a schematically sectional view showing a condition where a part of barrier metal layer is removed from the semiconductor wafer of FIG. 15.

On the object 10 subjected to the electrolytic plating, the superfluous Cu-film 16 is piled on the surface A. In the prior art, it has been carried out to flatten the object 10 (10c) shown in FIG. 1 or 14 owing to the removal of the metal film 16 by the CMP method, as shown in FIG. 16. However, since the CMP method is identical to a method of mechanically flattening the object while using a chemical abrasive, such as slurry, and a polishing pad, the insulating film 14 is also ground inevitably, as described with reference to FIG. 22. Consequently, disadvantageous scratches (tiny cuts), dishing and erosion are produced on the surface A of the insulating film 14, which is far from an ideal flat surface as shown in FIG. 16.

Figure 4:
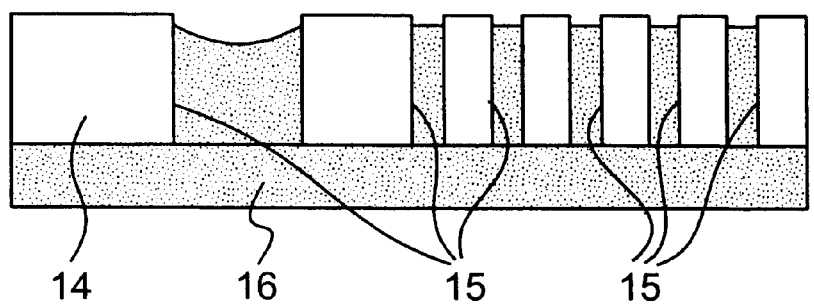
FIG. 4 is a schematically sectional view of the metal plating film formed on the object by the plating apparatus of FIG. 1.
Figure 22:
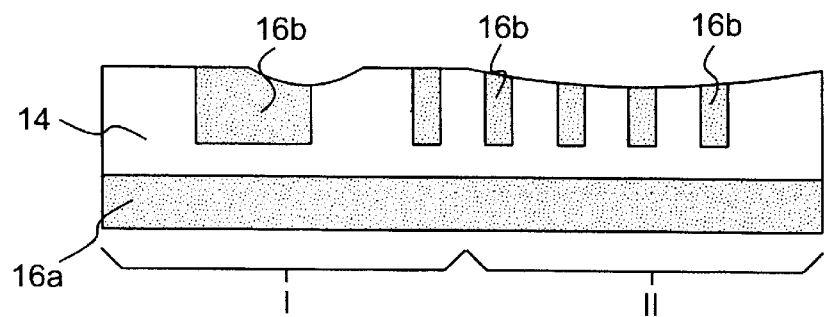
FIG. 22 is a schematically sectional view for explanation of dishing and erosion as the evils of over-polishing.

While, according to the plating method of the invention, it is executed at the planarization process of FIG. 5 (step 1020) to supply the plating device 100 with the backward current for all or partial removal of the metal film 16b, thereby accomplishing the planarization of the surface A. In the plating method of FIG. 1, it is difficult to control the plating process so as to educe the metal only in the contact hole 15 of the object 10. However, the inventors of the invention paid attention to a fact that once an excessive amount of metal film 16 is formed on the surface A of the object 10, it is relatively easy to flatten the surface 17 generally. Then, the inventors finally found that, in the plating method of FIG. 2, the application of backward current allows the metal film 16 to be removed from the generally-flattened surface 17 uniformly. For explanation of illustrative effects of the invention in comparison with FIG. 22, FIG. 4 illustrates a plating film formed on the object 10 by the plating device of FIG. 1.

In FIG. 1, when the switch 50 is controlled so that the control unit 60 allows the backward current to flow between the electrode 12a and the electrode plate 20 (at step 1106 of FIG. 6), the electrode plate 20 turns from the positive pole to the negative pole causing the deoxidization, while the electrode 12a turns from the negative pole to the positive pole causing the oxidation. As a result, the produced plating film is again dissolved into the solution due to the oxidation from Cu to $Cu^{2+}$, causing the reduction in thickness of the metal film 16 piled up on the surface A. The electrode(s) 12a is arranged on left and right sides of the object 10 in FIG. 2 and therefore, it is possible to monitor the current value owing to the existence of film just below the electrode 12a. Since the current value in the object 10 is reduced with the reduction of film thickness, it is possible to control the film thickness by previously calculating a current value flowing at the desired film thickness. Such the control is performed by the control unit 60 connected to e.g. a current meter.

Referring to FIG. 6, when the control unit 60 directly or indirectly judges that the thickness of the metal film 16 on the object 10 reaches the designated thickness (e.g. about ⅒ of a film thickness before switching the direction of current) by current value, time passage and the other parameters (step 1108), it is executed to complete the plating process.

Figure 18:
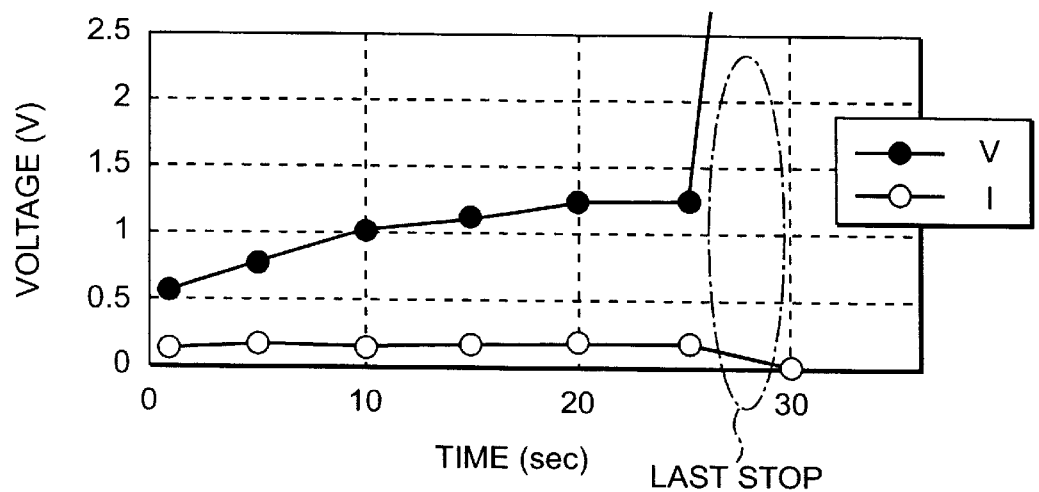
FIG. 18 is a diagram showing the changes of voltage and current when a metal film is removed from a tip having no pattern.
Figure 19:
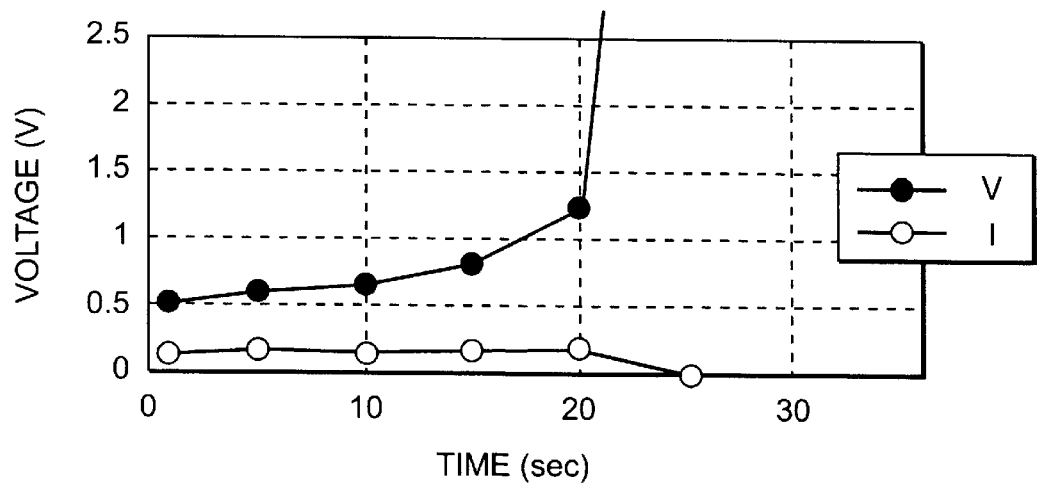
FIG. 19 is a diagram showing the changes of voltage and current when the metal film is removed from a tip having a pattern.

When the plating process of FIG. 2 has been maintained till the metal film 16 is removed from the surface A of the object 10, then the planarization process (steps 1020, 1022) of FIG. 5 is also completed. In this case, due to the removal of the metal film, there can be observed a radical rise in voltage and a reduction in current. FIGS. 18 and 19 show these phenomenons, in which FIG. 18 illustrates the case of a not-patterned tip and FIG. 19 does the case of a patterned tip. Note that, in these experiments, an appropriate current value of 0.14 mA was obtained from the IV curve of the copper sulfate solution on use and thereupon, the plating process was performed with this constant current value. As obviously from these figures, it will be understood that the removal of the metal film causes a resistance to be increased abruptly, causing the voltage to be elevated and the current to be reduced radically. Accordingly, it is possible to detect the ending point of the removal of metal film by monitoring both current and voltage or either one of them, whereby the removal process can be controlled by the control unit 60.

In this case, the plating process shown in FIG. 2 (steps 1106 and 1108 of FIG. 6) is substituting for all of the conventional CMP method. Therefore, as a result of such the plating process, it is possible to provide a high-quality semiconductor wafer that does not exhibit the over-polishing at all.

While, if the plating process shown in FIG. 2 is completed at a point of time when the thickness of the metal film 16 on the object 10 reaches about ¹⁄₁₀ of a film thickness before turning the switch 50 (step 1108), it means that the plating process shown in FIG. 2 is substituting for part of the conventional CMP method. In this case, the planarization process (steps 1020, 1022) of FIG. 5 is continued by CMP, etching, wet-chemical treatment, etc. As to the CMP method, for example, a CMP device includes a rotary plate, a pad mounted on the rotary plate, means for pressing the object 10 on the rotary plate and means for dropping an abrasive (slurry) onto the pad. As the CMP method can adopt any technique known in this field, the detailed descriptions about CMP will be eliminated. In the wet-chemical treatment, the excessive plating film can be removed by dipping the object 10 into a chemical solvent (i.e. dipping a plated wafer in a solution capable of melting the metal). In this way, the merit of interrupting the plating process of FIG. 2 may come from a consideration to prevent the metal in the contact hole 15 from dissolving again. Even if the CMP method is selected, the application of CMP on the object 10 of FIG. 2 would allow the over-polishing to be remarkably improved in comparison with the application of CMP on the object 10 of FIG. 1 because of its remarkably-reduced quantity to be ground. Consequently, it is possible to provide the semiconductor wafer with high quality in comparison with the case of applying CMN on the object of FIG. 1.

Figure 20:
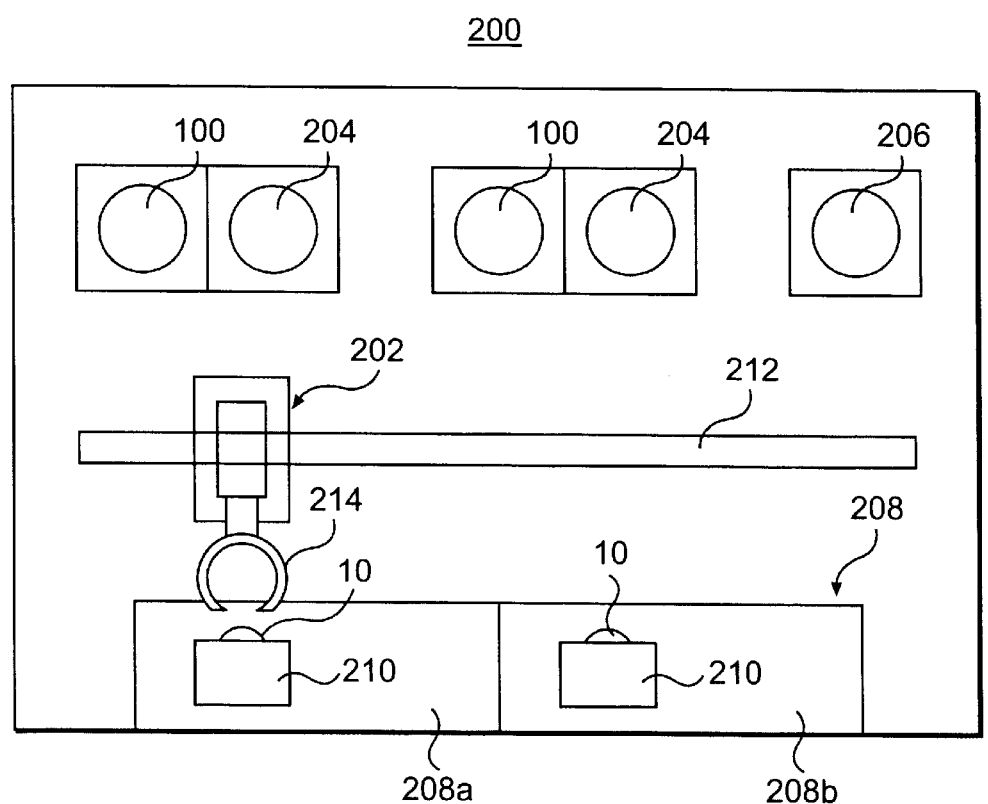
FIG. 20 is a schematic view of a plating system having the plating device.

FIG. 20 is a schematic view of a plating system 200 having the plating devices 100. In this embodiment, we describe a case that the object 10 to be plated is identical to a semiconductor wafer and the above-mentioned copper sulfate plating is applied on the wafer. As shown in FIG. 20, the plating system 200 includes a transfer device 202 for carrying the semiconductor wafer 10 and transporting it to a predetermined position, the plating devices 100 capable of each forming a Cu-plating film on the surface of the wafer 10 and also eliminating the film therefrom, cleaning devices 204 for each washing the wafer 10 having the plating film formed thereon, and a spin drier 206 as a drying device for drying the cleaned wafer 10. In the plating system 200 of the embodiment, there are provided the plating devices 100 and the cleaning device 204 in two pairs and the only spin drier 206, all of which are arranged in a line. In the modification, for example, the plating system may be provided with three plating devices 100 and two cleaning devices 204. That is, the plating device 100 is not always provided in combination with the cleaning device 204. The number of these devices changes in accordance with a plating condition required for the object.

Besides the above devices, the plating system 200 further includes a cassette station 208 equipped with a loading port 208*a* and an unloading port 208*b* for the wafers 10. In the cassette station 208, there are accommodated cassettes 210 each having a plurality of wafers 10, for example, twenty-five wafers. Laid between a group of the plating devices 100, the cleaning devices 204 and the spin drier 206 and the cassette station 208 is a rail 212 on which the transfer device 202 is arranged with a transfer arm 214.

In operation, first move the transfer device 202 to the front of the cassette 210 accommodated in the loading port 208*a* of the cassette station 208 and absorb the wafer 10 in the cassette 210 by an absorbing mechanism of the transfer arm 214. Next, the transfer device 202 moves to the front of the plating device 100 while carrying the wafer 10 and subsequently accommodates it in the plating device 100. After completing to form the plating film on the wafer 10 as mentioned above, the wafer 10 is absorbed by the transfer arm 214 and transported to the interior of the cleaning device 204. Further, the cleaned wafer 10 after removing the plating liquid is again absorbed and reversed by the transfer arm 214 and transported to the interior of the spin drier 206. Next, the wafer 10 dried in the spin drier 206 is again absorbed by the transfer arm 214 and transported to the front of the cassette 210 accommodated in the loading port 208*b* of the cassette station 208 spin drier 206. In this way, the wafer 10 is finally accommodated in the cassette 210.

Figure 21:
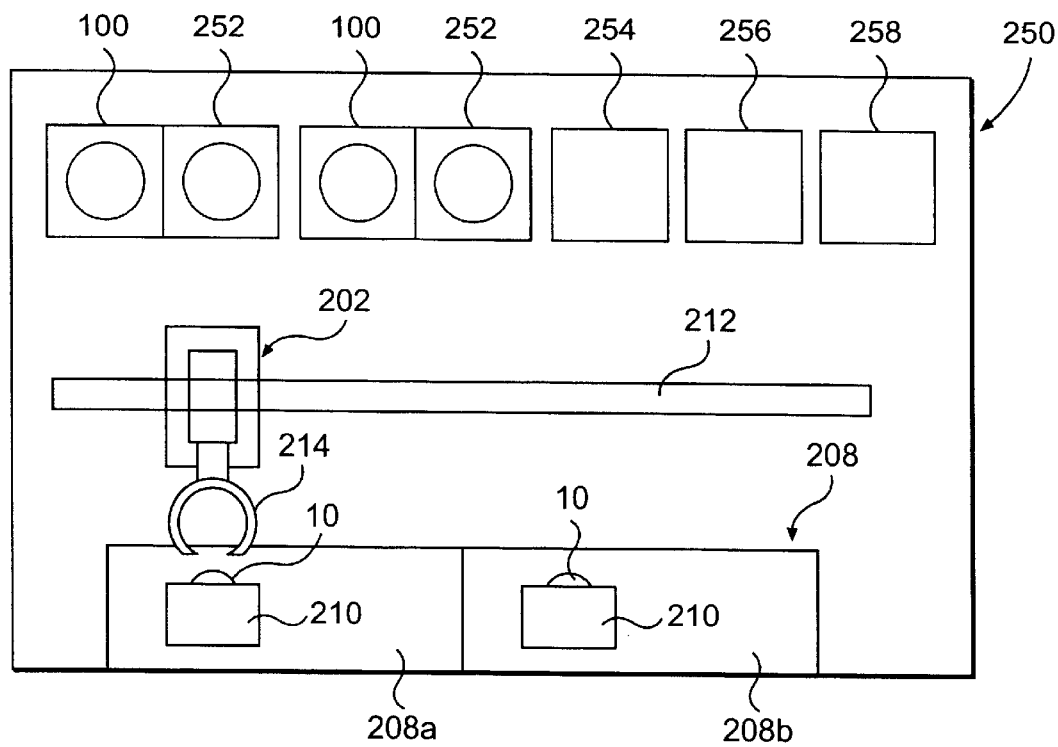
FIG. 21 is a schematic view of another plating system having the plating device.

Although the spin drier 206 is arranged independently of the cleaning devices 204, the present invention is not limited to this structure and therefore, they may be replaced with a cleaning and drying device 252 for cleaning and drying the object. For example, there may be provided a plating system 250 as shown in FIG. 21. The plating system 250 has the cleaning and drying devices 252 in place of the cleaning device 204 and the spin drier 206 besides the plating devices 210. Again, the plating system 250 further includes a device 254 having a function to calculate and measure the film thickness of the plating film, a barrier metal etching bath 256 having a function to detect the ending point of the barrier metal etching, and an annealing device 258 for annealing the object, accomplishing the designated treatment more effectively.

Although the embodiment of the present invention has been described with reference to the drawings, the present invention is not limited to only the above-mentioned embodiment and therefore various changes and modifications may be made within the scope of gist.

For example, although the negative current of FIG. 3 has a constant current value, it may be replaced by a pulse current whose value is variable within the range of negative values. The same thing can be said of the positive current of FIG. 3.

Although the plating device 100 shown in FIG. 1 or 2 employs the copper sulfate solution as an electrolytic liquid, there is no need to limit the electrolytic liquid to the copper sulfate solution. For example, a solution containing phosphorus acid may be used and furthermore, it may be replaced with a solution containing any one of acetic acid, nitric acid and hydrochloric acid.

In case of using any one of copper sulfate solution, phosphorus acid solution, acetic acid solution, nitric acid solution and hydrochloric acid solution as the electrolytic liquid, upon storing appropriate current values, which could be obtained from respective IV curves corresponding to the respective electrolytic liquids, in a data base, it may be carried out to read one current value corresponding to the electrolytic liquid on use, out of the data base. If done as above, the treatment could be performed at the current value corresponding to the electrolytic liquid on use. Further, the monitoring of respective values of voltage and current continuously would allow the ending point in removing the plating film to be detected with ease.

Additionally, in case of two (or more) plating devices 100 in one plating systems as shown in FIG. 20 or FIG. 21, the forward current may be supplied to the first plating device to form the plating film on the object on condition of supplying the backward current to the second plating device in order to remove the plating film. Furthermore, it may be executed to differentiate the electrolytic liquids used in the first plating device and the second plating device, from each other. For example, the first plating device may employ the copper sulfate solution, while the second plating device may employ the electrolytic liquid containing the phosphorus acid.

Further, this method of removing part of the metal film formed on the object 10 by the supply of backward current to the object 10 and the electrode plate 20, is also applicable to a case of removing the barrier metal layer 11. Further in the plating system 200 of FIG. 16, it may be equipped with an etching bath for processing the barrier metal.

As mentioned above, according to the plating method and device of the invention, since the use of backward current allows the superfluous metal film to be removed without damaging on the surface of the object, it is possible to reduce or eliminate the possibility of over-polishing derived from grinding, thereby providing the plating treatment of high quality.

What is claimed is:

1. A plating method comprising the steps of:
    dipping an object to be processed and an electrode plate into a solution containing designated metal ions;
    allowing a forward current to flow through the object and the electrode to form a metal film originated from the designated metal ions on the object;
    measuring the forward current;
    calculating a thickness of the metal film formed on the object by the measured forward current;
    determining whether the calculated thickness of the metal film is in excess of a predetermined thickness; and
    removing at least a portion of the metal film on the object by allowing a backward current to flow through the object and the electrode when the thickness of the metal film is determined to be in excess of the predetermined thickness.

2. A plating method as defined in claim 1, wherein the forward current is an electrical current having its variable magnitude.

3. A plating method as defined in claim 1, wherein the backward current is an electrical current having its variable magnitude.

4. A plating method as defined in claim 1, wherein the metal ions are copper ions and the object to be processed is a semiconductor wafer having a plurality of contact holes.

5. A plating method as defined in claim 1, wherein the removing step removes the metal film to a predetermined second thickness.

6. A plating method as defined in claim 5, wherein the second thickness is one tenth of the predetermined thickness prior to the removing step.

7. A plating method as defined in claim 5, further comprising removing the remaining second thickness by chemical mechanical polishing after the removing step.

8. A plating method as defined in claim 1, further comprising forming a barrier metal layer on the object to be processed.

9. A plating method as defined in claim 8, further comprising forming a seed layer on the object to be processed.

10. A plating method as defined in any of claims 1 to 9, wherein the solution containing the metal ions is a solution containing at least sulfuric acid.

11. A plating method as defined in any of claims 1 to 9, wherein the solution containing the metal ions is a solution containing at least phosphoric acid.

12. A plating method as defined in any of claims 1 to 9, wherein the solution containing the metal ions is a solution containing at least acetic acid.

13. A plating method as defined in any of claims 1 to 9, wherein the solution containing the metal ions is a solution containing at least nitric acid.

14. A plating method as defined in any of claims 1 to 9, wherein the solution containing the metal ions is a solution containing at least hydrochloric acid.

15. A plating method as defined in claim 1, wherein all the method steps are performed in a same electroplating cell containing the solution.

* * * * *